United States Patent

Dill

[15] 3,700,976

[45] Oct. 24, 1972

[54] INSULATED GATE FIELD EFFECT TRANSISTOR ADAPTED FOR MICROWAVE APPLICATIONS

[72] Inventor: Hans G. Dill, Costa Mesa, Calif.

[73] Assignee: Hughes Aircraft Company, Culver City, Calif.

[22] Filed: Nov. 2, 1970

[21] Appl. No.: 86,017

[52] U.S. Cl. ............317/235 R, 317/235 B, 307/304

[51] Int. Cl. ..............................................H01l 11/14

[58] Field of Search....................................317/235

[56] References Cited

UNITED STATES PATENTS

| | | | |
|---|---|---|---|
| 3,304,469 | 2/1967 | Weimer | 317/235 |
| 3,328,601 | 6/1967 | Rosenbaum | 317/235 |
| 3,634,702 | 1/1972 | Drangeid | 317/235 |
| 3,258,663 | 6/1966 | Weimer | 317/235 |
| 3,313,959 | 4/1967 | Dill | 317/235 |
| 3,378,688 | 4/1968 | Kabell | 317/235 |
| 3,475,234 | 10/1969 | Kerwin et al. | 317/235 |
| 3,514,676 | 5/1970 | Fa | 317/235 |
| 3,528,168 | 9/1970 | Adamic | 317/235 |
| 3,562,608 | 2/1971 | Gallagher et al. | 317/235 |

OTHER PUBLICATIONS

IBM Tech. Disel Bul. " Inverted Thin-Film Transistor" by Fowler et al., Vol. 11, No. 9, Feb. 1967, page 1137

*Primary Examiner*—Jerry D. Craig
*Attorney*—W. H. MacAllister and Paul M. Coble

[57] ABSTRACT

Solid state field effect switch devices useful in microwave applications. Devices disclosed embody resistive noninsulative layer material insulated from a supporting semiconductor body. Electrodes connected to the layer material and the body are arranged so that signals applied to one electrode can, by field effect action, alter the electrical conductivity of a path within the device which extends between two other electrodes.

5 Claims, 8 Drawing Figures

Figure 1:
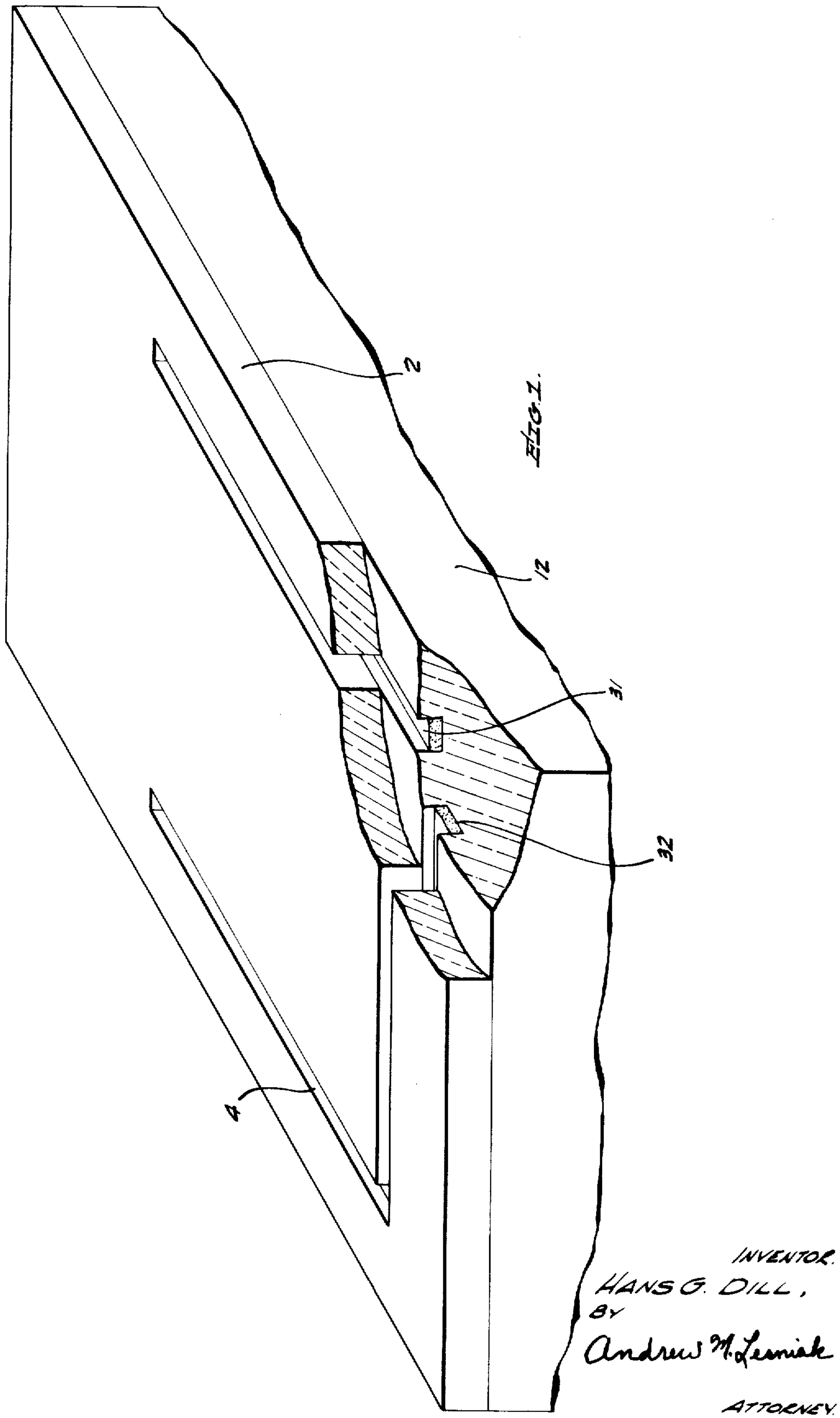

INVENTOR.
HANS G. DILL,
BY
Andrew M. Lesniak
ATTORNEY.

INSULATED GATE FIELD EFFECT TRANSISTOR ADAPTED FOR MICROWAVE APPLICATIONS

The present invention relates to improved solid state field effect switch devices and more particularly to improved metal-oxide-semiconductor-field effect transistors (MOSFETS) which include a high resistivity noninsulating layer therein to which electrical connection is made in such a way that the electrical conductivity of a channel region within the device located between respective device connection terminals can be altered by the action of an electric field.

Insulated gate field effect transistors (IGFETS) and metal oxide semiconductor field effect transistors (MOSFETS) have gained increasing popularity in recent years. Many different types and kinds of solid state switch devices made operational by utilization of electric field effect phenomenon have been constructed and utilized. Various nomenclatures have have been applied to such devices and the terms IGFET and MOSFET have acquired accepted meaning in the microelectronic art and have been applied to devices having what is called source, drain, and gate or control electrodes. In the most common devices in the category of interest herein laterally spaced source and drain electrodes make connection to respective source and drain regions in a semiconductor substrate which intersect with a common substrate surface whereat the source and drain regions are contacted by the source and drain electrodes. The source and drain regions are laterally separated by a channel region therebetween covered with at least one layer of insulating material, typically a semiconductor oxide, and a gate or control electrode on top of the insulating layer connects thereto in a limited area overlying the channel region.

Some of the more recent devices make use of polycrystalline semiconductor layer material that is of high resistivity but noninsulating in electric characteristic for assorted purposes. Examples of such devices may be found in a number of places.

The fabrication and production of solid state field effect transistors in general necessitates that various compromises be made in constructing such transistor devices and, as a consequence, any given device can not meet all of the requirements which must be satisfied in different device applications. Due to the interplay of various device and fabrication necessities, constant efforts are today being carried on by the microelectronic industry to develop simple and inexpensive field effect transistors which are easy to construct and meet particular application requirements.

With the passage of time increasing interest is being evidenced in supplying field effect transistors which can be used in microwave signal switching applications with due consideration being given to the costs involved.

The present invention in its more specific aspects provides different forms of field effect transistors which possess electrical characteristics rendering them useful for microwave switching applications without incurring undue cost expenditures for the production of same. The present invention in a general aspect thereof provides field effect transistors which possess certain advantages and attributes not heretofore achieved in existing field effect transistors.

A figure of merit of an IGFET or MOSFET device to be used for switching microwave signals is $f_c = 1/(2\pi C\sqrt{R_f R_o}$ wherein fc represents a cutoff frequency, C represents the stray capacitance of the device when it is not conducting (i.e., turned off), $R_f$ represents the ohmic loss in the device when it is conducting (i.e., turned on), and $R_r$ represents the ohmic loss in the device when it is not conducting. The higher the figure of merit or cutoff frequency $f_c$, the better the device in terms of intended application as a microwave switch device. With this criteria in mind, the applicant has provided two quite unique field effect transistor embodiments which can be used for microwave switching and satisfy certain cost criteria. The field effect transistors provided each include high resistivity noninsulating layer material forming an integral transistor element arranged to promote the purpose at hand.

It is therefore a broad object of the present invention to provide unique field effect transistors exhibiting improved electrical switching characteristics.

It is another object of the present invention to provide field effect transistors, adapted for use as microwave switches, which are constructed to minimize, within practical limitations, ohmic and capacitive losses occurring therein when connected into and used in a switching circuit.

Figures 4, 5:
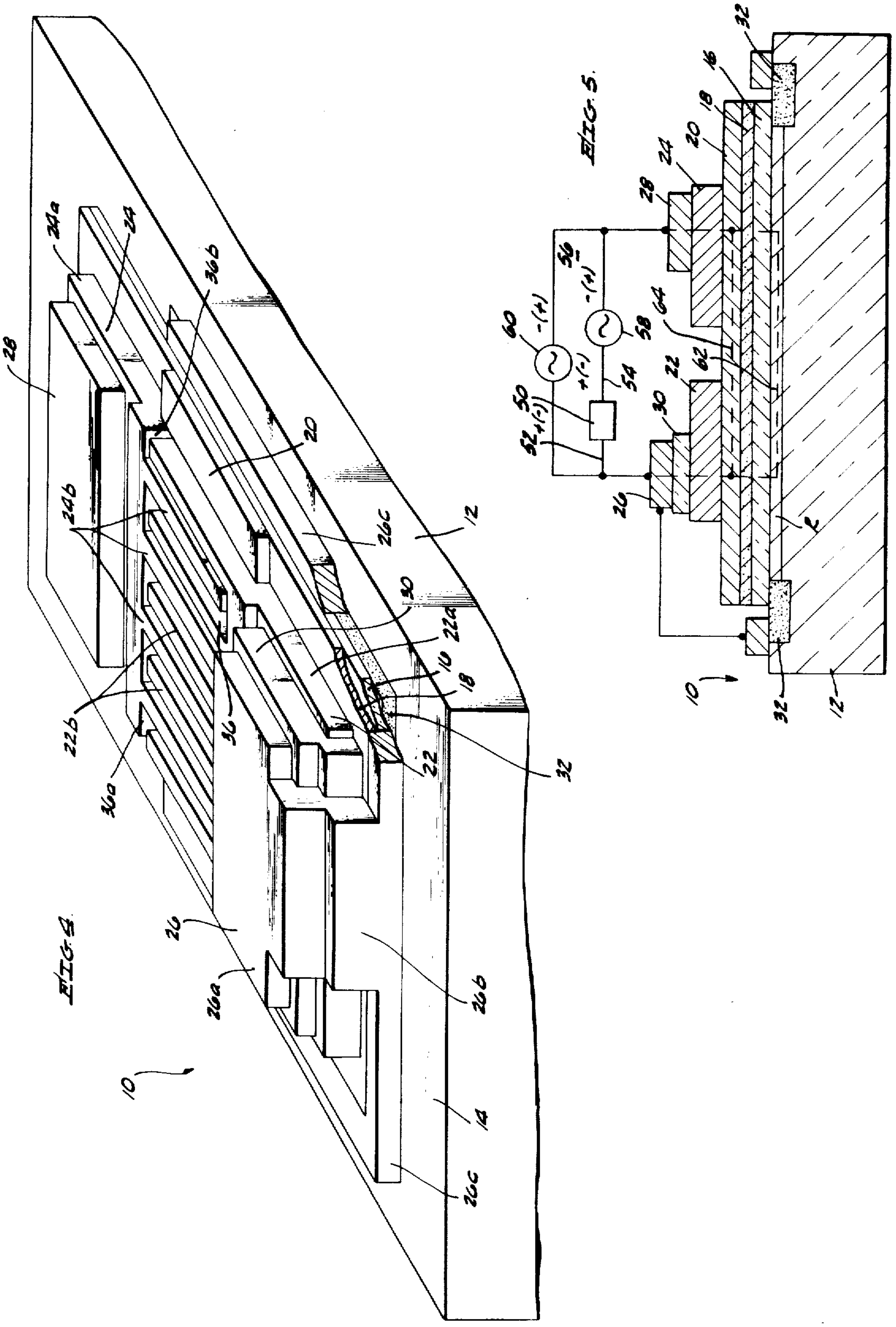

Still further objects and advantages of the present invention will become apparent upon reading the following specification which refers to the accompanying drawings wherein:

FIGS. 1 to 4 schematically depict a first field effect transistor embodiment at subsequent stages of fabrication; the embodiment being completed in FIG. 4.

FIG. 5 is illustrative of the use of the first embodiment in a microwave switching application.

Figure 6:
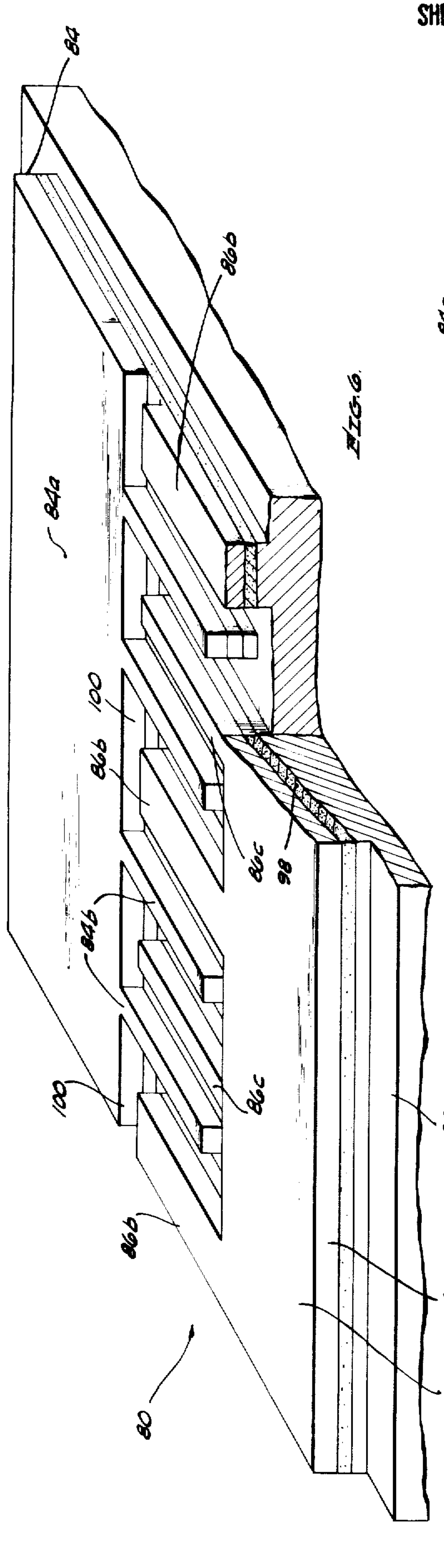
Figure 7:
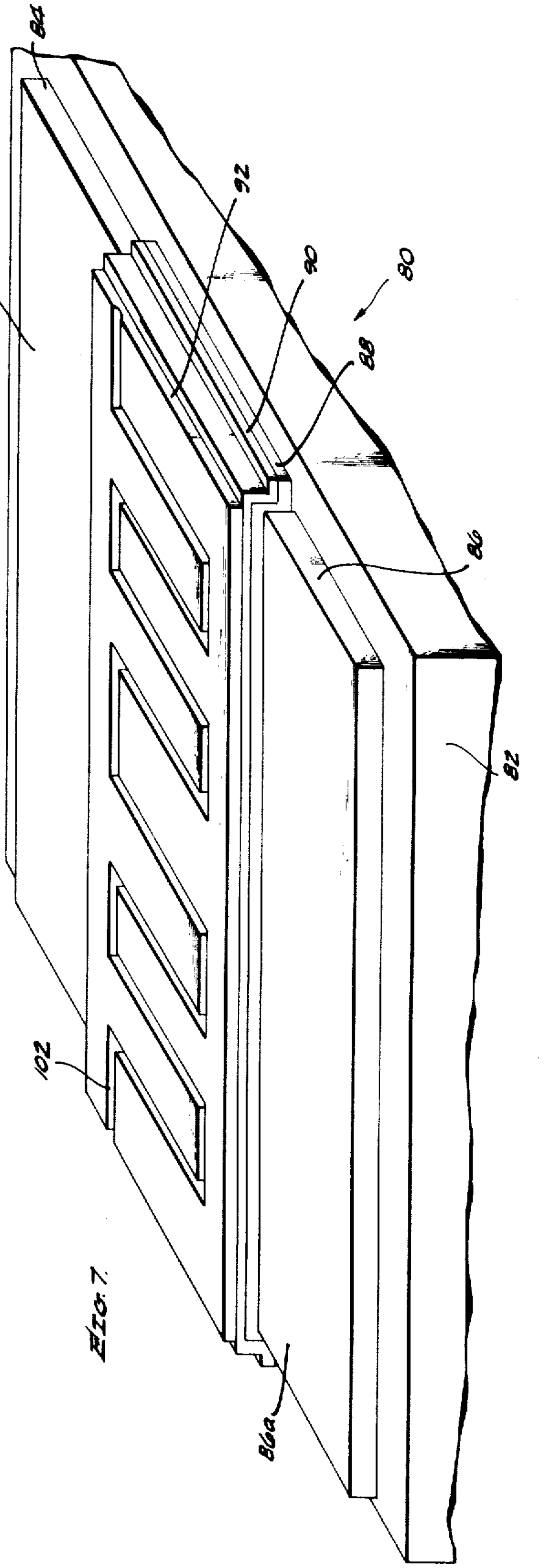
Figure 8:
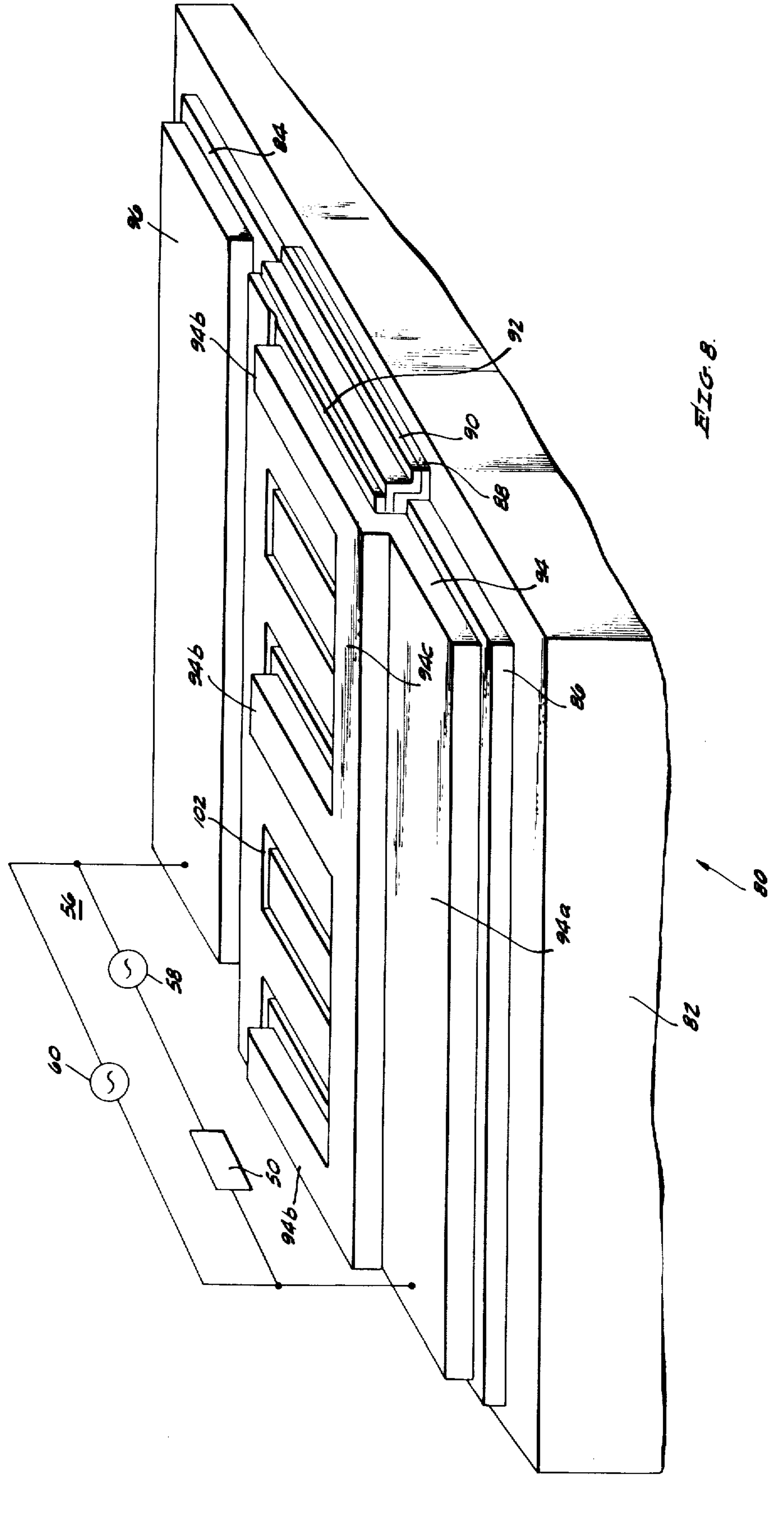

FIGS. 6 to 8 schematically depict a second field effect transistor embodiment at successive stages of fabrication; the embodiment being completed in FIG. 8 and being connected in a microwave switching circuit.

Referring initially to FIG. 4, wherein a completed field effect transistor constituting a first embodiment of the invention is shown, it is explained that the transistor 10 shown therein comprises, by way of specific example, a silicon substrate or portion thereof 12 having a top surface 14. A first layer 16 of silicon dioxide, shown partially cutaway, on top of the surface 14, separates a second layer 18 of silicon nitride, shown partially cutaway, from the substrate 12. A third layer 20 of polycrystalline silicon material on top of part of the layer 18 is contacted by interdigitated electrodes 22 and 24, called drain and source electrodes respectively, which are of molybdenum as a specific example. A pair of contact electrodes 26 and 28 on top of the substrate 12, each made of aluminum or gold, for example, are provided.

The contact electrode 26 includes a section *26a* which is on top of a fourth layer of silicon dioxide 30 located upon part of the drain electrode 22, an intermediate section *26b* extending sidewardly and downwardly toward the substrate surface, and a further section *26c*, shown partially cutaway, located upon the substrate surface and extending partway around the layers thereon. The electrode portion *26a*, the layer 30 and the portion of the electrode 22 which is beneath layer 30 together comprise a capacitor.

A highly conductive or high conductivity region 32, which is exemplarily U-shaped in plan view, inside the substrate adjacent the top surface thereof is contacted by the electrode section 26c in the manner shown for a purpose to be described hereinafter.

The drain electrode 22 is comprised of a section 22a, beneath the silicon dioxide layer 30, common to a plurality of parallel laterally spaced sections 22b each of which have a finger shaped configuration. The source electrode 24 is similarly comprised of a section 24a, beneath the aluminum contact electrode 28, common to a plurality of parallel, laterally spaced sections 24b, each of which have a finger shaped configuration. The spacing between the source and drain sections 24b and 22b is typically about 0.2 mils, each source and drain section being typically about 0.3 mil wide.

The sections 22a and 24a of the electrode 22 and 24 are located on opposite lateral sides of the sections 22b and 24b thereof and each provides a top surface of enlarged area to which electrical connection can be made via the contact electrodes 26 and 28 respectively.

The sections 22b and 24b of the electrodes 22 and 24 are interdigitated in the manner shown, being separated laterally by a narrow, winding gap 36 devoid of electrode material. The path of the gap 36 between the opposed ends 36a and 36b thereof winds laterally back and forth between opposite sides of a center line transverse to the direction of length of the sections 22b and 24b in such a way that the distance separating laterally adjacent sections 22b and 24b remains substantially constant at each point along the path.

The high conductivity region 32 is made to be highly conductive by doping it with a high concentration of suitable dopant (e.g., phosphorous which is an n-type dopant). Doping of the region 32 is preferrably accomplished by using a conventional ion implantation technique but may also be accomplished by a utilizing dopant diffusion technique. The balance of the substrate (exclusive of the region 32) is preferably of material which is substantially free of dopant materials preferably possessing as high a resistivity as possible.

The substrate 12 may specifically be composed of monocrystalline silicon material which is essentially free of N or P type dopant material so as to be of essentially intrinsic (pure, undoped) semiconductivity. As a practical matter the substrate may contain a slight amount of N and/or P type dopant materials so as to be of slightly extrinsic N or P type semiconductivity depending upon the amount of N and/or P type dopant materials present in the substrate.

Since region 32 is utilized to provide charge carriers during transistor operation it is preferred that the region be doped with an N type dopant which provides electrons rather than with a P type dopant which provides holes since electron mobility is higher than hole mobility and since the higher electron mobility promotes the switching speed of the transistor 10 during its operation. Stated differently it is preferred that the region 32 be doped to exhibit N+ type semiconductivity, rather than P+ type semiconductivity, by heavily doping the region with an N type dopant. This preference exists regardless of whether the balance of the substrate (other than region 32) exhibits a degree of N or P type semiconductivity (preferably weakly N or weakly P). Generally it is desirable to avoid the creation of PN junction, however poor, between the region 32 and the balance of the substrate but in a fundamental sense it is immaterial whether or not a PN junction is created and since the substrate is preferably only slightly doped any PN junction which may be created will have insignificant effect upon transistor operation.

The fabrication of the just described transistor 10 may be accomplished as follows. First, the structure shown in FIG. 1 is produced. In order to arrive at the FIG. 1 structure, a silicon substrate 12 of high resistivity, typically greater than 10,000 ohms per centimeter, of slightly n type intrinsic semiconductivity (for example), is provided with a layer of pyrolytic silicon dioxide 2, which will later be removed, about 5,000 angstrom thick deposited pyrolytically from a suitable ambient on the top surface of the substrate which is heated to a temperature in the range of 400° to 500° centigrade. The thickness of the layer 2 is such that it can be used as an ion implantation mask.

Next, the layer 2 is covered with a layer of photoresist (not shown) which is selectively exposed to ultraviolet light through a pattern in a mask. After exposure to ultraviolet light the photoresist layer is developed to remove unwanted portions thereof and to remove a U-shaped area of the photoresist layer to uncover a U-shaped area of the layer 2 beneath which a region 32 is to be located. The pyrolytic silicon dioxide material on the substrate is next etched away in the areas thereof from where photoresist has been removed by etching the areas of the layer 2 using a conventional etchant solution such as water diluted hydrofluoric acid consisting of essentially 95 percent water and 5 percent hydrofluoric acid by weight to form a U-shaped groove 4 in the layer 2.

Next, after forming the groove 4 in the layer 2, an etchant solution which controllably etches silicon, such as that known as CP4 or a standard solution of hydrofluoric acid and nitric acid, is used to etch a shallow U-shaped depression 31 into the substrate, beneath the groove 4, of a controlled depth. This is done for convenience in fabrication of the ultimately obtained transistor since the resultant depression is useable as a visual reference in subsequent mask alignment steps. In the ultimately obtained transistor the depression 34 serves no particular purpose and consequently the etching of the depression 32 may be dispensed with if careful mask alignment is performed at later fabrication stages. To simplify the showings in FIGS. 2, 3, and 4, the depression 31 is deleted in each.

Next, ion implantation is performed through the etched out area of the layer 2 using an ion implantation apparatus to ion implant, for example, phosphorous, an n-type dopant, or other suitable dopant material in the substrate to form the region 32. Phosphorous ion implantation can be performed with the substrate maintained at about 40° centigrade. At this point, the incomplete device is as shown in FIG. 1 with the exception that the photoresist on the layer 2 is not shown in FIG. 1.

Next, the surface of the substrate is stripped bare using a suitable stripper solution to render the surface clean for the formation of layer forming materials thereon. To arrive next at the fabrication stage shown in FIG. 2, a layer of thermally grown silicon dioxide about 600 angstroms thick is formed by heating the substrate to about 925° centigrade in a suitable wet ambient. Next, silicon nitride ($Si_3N_4$) is deposited from a suitable ambient onto the substrate which is heated to about 850° centigrade to form a layer about 300 angstroms thick. Next, a layer of polycrystalline silicon is deposited from a suitable silane ($SiH_4$) containing ambient while heating the substrate to a temperature in the range of 800° to 850° centigrade. Shortly after the deposition of the polycrystalline material starts, a controlled amount of diborane gas ($B_2H_6$) is introduced into the ambient so that boron separated form the diborane gas becomes incorporated in the polycrystalline silicon layer as its thickness increases. By this expedient, which is somewhat optional in nature, the resistivity of this layer can be regulated by controlling the amount of boron introduced into the layer, the boron therein altering the resistivity of the polycrystalline silicon in a readily controllable manner. The resistivity of this layer can be easily made to vary from about 1,000 ohms per square up to about several megohms per square, as desired.

Figures 2, 3:
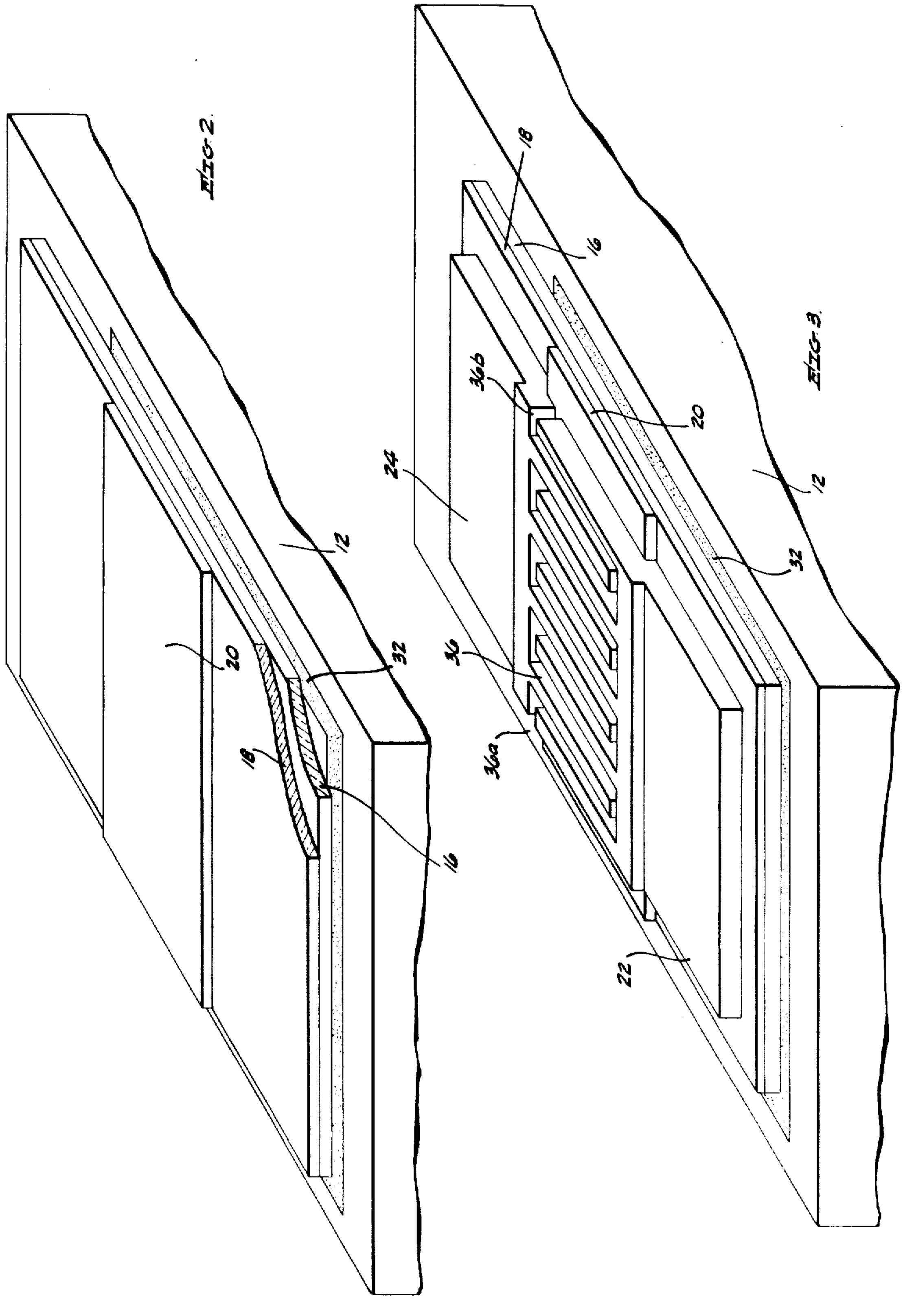

The layers on the substrate are next shaped using glass masks with metal patterns thereon, photoresist layers, and etchant solutions of a familiar, conventional nature to leave an insulating layer 16 of thermally grown silicon dioxide, an insulating layer 18 of silicon nitride, and a high resistivity noninsulating film 20 of polycrystalline silicon which are each limited areawise substantially as shown in FIG. 2; the layers being accurately defined in lateral extent and position relative to the region 32 of the substrate.

In proceeding to the next fabrication stage shown in FIG. 3, molybdenum, or chromium or other metal material, is deposited onto the substrate to cover the entire top surface thereof. The deposited molybdenum is masked, etched, and unmasked to form electrodes 22 and 24 therefrom having the desired shape.

Next, to arrive at the FIG. 4 stage of fabrication a layer of pyrolytic silicon dioxide or of silicon nitride is deposited on the entire top surface of the substrate, masked and etched to leave behind a layer 30 of limited area. The choice of material used for the layer 30 depends upon whether material having the dielectric constant of pyrolytic silicon dioxide or silicon nitride is wanted.

Contact electrodes 26 and 28 are formed on the existing structure using, for example, aluminum deposition, pattern masking, and etching techniques to arrive ultimately at the transistor structure 10 shown in FIG. 4, to obtain aluminum contact electrodes 26 and 28.

Certain variations in the aforedescribed process are readily obvious to one skilled in the transistor fabrication technology. Changes can be made in the materials used and sequency of process events. Other semiconductor material such as germanium or gallium arsenide may be used to provide the substrate 12 instead of silicon which is used in the example. The electrodes 22 and 24 need not be made of the same material or at the same time and could, for example, be composed respectively of molybdenum and aluminum. Other insulating materials besides thermally grown silicon dioxide and silicon nitride may be used to define the layers 16 and 18 and it may suffice to utilize only a single layer of suitable insulating material to separate the layer 20 from the substrate rather than the single composite layer, composed of the layers 16 and 18, providing a desired combined thickness. The layer 20 need not necessarily be made of polycrystalline silicon material but may be made of other high resistivity noninsulating layer material which may include germanium or other semiconductor material or selected metal materials which can be deposited in a thin continuous solid layer to provide an overall resistance comparable to that provided by the polycrystalline silicon layer 20. It is thus to be recognized that although a specific example has been given in describing the FIG. 4 device, the invention is not limited in nature to the specifics given but is of a scope commensurate with the broad inventive concepts involved in the specific given embodiment.

FIG. 5 illustrates the utilization of the field effect transistor 10 in a microwave switching application. A load 50 is connected between a pair of circuit output terminals 52 and 54 of a microwave switch circuit 56 including the field effect transistor 10, a microwave source 58, and a switching signal source 60. In FIG. 5 the transistor 10, depicted in completed form in FIG. 4, is shown, with certain details thereof having been omitted for simplicity, and numerals identifying the elements thereof are supplied which correspond to the numerals used to identify the elements of the transistor as shown in FIG. 4. The material of the layer 20 between the electrodes 22 and 24 constitutes a resistance in shunt with the substrate region R and the region R is capacitively coupled to each of the electrodes 22 and 24 via the layers 16, 18, and 20 and such capacitive coupling is made as large as possible.

As shown in FIG. 5 the microwave source 58 is connected in series with the load 50 and both are connected to the electrodes 26 and 28 of the transistor 10. The switching signal source 60 is connected in parallel with the load 50 and the microwave source 58 and is also connected to the electrodes 26 and 28 of the transistor 10. The switching signal source 60 and the microwave source 58 each supply signals typically of differing frequency, the source 60 generating, for example, a pulsed signal of a frequency $f_1$ and the source 58 generating, for example, a microwave of a frequency $f_2$ wherein the frequency $f_2$ is, in a usual application, much higher than the frequency $f_1$ so that the microwave signal supplied by the source 58 to the load 50 will repetitively be chopped off at a rate corresponding to the frequency $f_1$ as the source 60 effects switching of the transistor 10. The electrode 26, the insulating layer 30, and the drain electrode 22, form a capacitor in the microwave switch circuit 56 which is connected between the drain electrode 22 and the balance of the circuit 56. Therefore, any direct current component contained in the microwave current, supplied by either of the sources 58 and 60, will be unable to flow through the high resistivity noninsulating layer 20 as could occur if electrical connection had not been made indirectly to the drain electrode 22, as is done, via electrical connection to the electrode 26 but instead had been directly, as is not done, to the drain electrode 22.

Switching of the transistor 10 between conductive and nonconductive states is performed by including a conductive path within the substrate 12 near the top surface thereof when the transistor is operated in the switching circuit 56. In FIG. 5 the numeral 62 represents a current path in the substrate and the numeral 64 represents a current path in the layer 20.

When the switching signal source polarity is such as to made the electrode 26 positive voltage-wise relative to the electrode 24 the transistor, being an n channel transistor, is in a nonconductive state wherein only a low level signal passes therethrough. In the nonconductive state of the transistor a small level leakage signal current flows through the layer 20 in the path 64 and a small level leakage signal current flows through the substrate in the region R in the path 62. By making the layer 20 of high resistance between the electrodes 22 and 24 the leakage current which flows in the layer 20 is held to a low level.

When, on the other hand, the switching signal source voltage polarity is such as to make the electrode 26 negative voltagewise relative to the electrode 24 the transistor is in a conductive state wherein a high level signal passes therethrough. In the conductive state of the transistor, a high level signal current flows through the region R in the path 62 while a low level leakage current flows in the layer 20 in the path 64. The level of leakage current which flows in the layer 20 remains about the same when the transistor is either conducting or is not conducting and such leakage current is relatively negligible and insignificant in comparison to the level of current which flows in the region R when the transistor is conducting. With the transistor in the conductive state the currents flowing in the transistor are supplied by the switching circuit 56 via the capacitor comprised of the elements 26, 30, and 22.

When the transistor is in the conductive state a copious supply of charge carriers (i.e., electrons when the region 32 is doped with an N-type dopant material) move laterally out from the region 32 into the region R laterally adjacent thereto. The region R becomes flooded with the charge carriers and consequently the resistivity of the region R decreases to a low value much less than the resistivity of the region R in the absence of carrier flooding.

The signal from the source 60 which is applied between the electrodes 26 and 28 establishes an electric charge field within the insulating layers 16 and 18 and the region R. The region R is flooded with charge carriers due to the action of the electrical field.

When the region R becomes more conductive, upon flooding with charge carriers, the transistor 10 conductively couples the source 58 to the load circuit 50 with the signal from the source 58 being coupled to the region R by capacitor action between the region R and the electrodes 22 and 24 respectively.

A second embodiment of the present invention is shown schematically in FIG. 8 wherein there is depicted a second field effect transistor 80 comprising a mono-crystalline silicon substrate 82 of relatively high resistivity, a molybdenum source electrode 84, a molybdenum drain electrode 86, a first insulating layer 88 of pyrolytic silicon dioxide about 400 angstroms thick, a second insulating layer 90 in silicon nitride about 400 angstroms thick, a third high resistivity noninsulating layer 92 of polycrystalline silicon, an aluminum control or gate electrode 94, comprised of sections 94*a*, 94*b*, and 94*c*, and an aluminum contact electrode 96. The transistor 80 is connected in a switch circuit 56 identical to that shown in FIG. 4 and earlier described. Accordingly, the components or elements of the circuit 56, other than the transistor 80, are labelled with the same numerals used to describe the identical, like elements in FIG. 5. Although the circuit 56 is the same in FIGS. 5 and 8 the way in which it is connected to the transistors 10 and 80 is slightly different. In FIG. 8, connection is made directly between the drain electrode 86 via the electrode 94 and the balance of the switch circuit 56 insofar as no capacitor like that shown in FIG. 5 is interposed between the drain electrode 86 and the balance of the switch circuit as illustrated in FIG. 5. Also, as shown in FIG. 8 the drain and source electrodes 84, 86 are each in surface area contact with the substrate 82 unlike the situation illustrated in FIG. 5 wherein the corresponding drain and source electrodes (22, 24) are in surface area contact not with the substrate (12) but rather are in surface area contact with the high resistivity noninsulating layer (20) and the insulating silicon nitride layer (18).

Details of the transistor 80 can be more clearly understood by discussion of the way it is constructed with reference to FIGS. 6 and 7 which show the transistor 80 prior to its completion at subsequent stages of fabrication thereof. The partially fabricated structure shown in FIG. 6 includes the drain electrode 86 and the source electrode 84 on the substrate 82. The substrate 82 includes an upraised highly conductive substrate surface adjacent region 98, shown partially cut away, located within a rectangular area of the top substrate surface common to the drain and source electrodes 86 and 84 thereon. In order to simplify FIGS. 7 and 8 the top substrate surface is shown in each without the upraised region 98 being indicated, it being understood that the source and drain electrodes 84 and 86 overlie and make contact with portions of such a region in the substrate 82.

In order to arrive at the FIG. 6 partly fabricated transistor 80 the top substrate surface, while barren of other material, is subjected to ion implantation to ion implant phosphorus (an N-type dopant) therein to make the implanted region be of N-type conductivity and of low resistivity and be about 0.1 to 0.2 microns deep (very shallow) with about $10^{18}$ dopant atoms per cubic centimeter at the surface of the implanted region. Instead of phosphorous one may ion implant boron into the top substrate surface in which event the implanted region is made to be of P-type conductivity and of low resistivity. Next, after ion implantation molybdenum, or aluminum or other metal, to be used for the electrodes 84, 86 is deposited in a layer onto the barren top substrate surface. The molybdenum layer, deposited to a thickness of about 2,000 angstroms at a temperature of about 400° centigrade within about 10 minutes, is coated with a photoresist layer which is selectively exposed to ultraviolet light through a mask having a pattern corresponding to the pattern of the source and drain electrodes to be formed. The photoresist layer is developed to remove selected areas thereof and to retain selected areas thereof under which the source and drain electrodes 84 and 86 are to be located.

Next, the molybdenum areas on the substrate which are free of photoresist are etched away to leave behind the source and drain electrodes 84 and 86 which each have the shape shown in FIG. 6 and which are separated by a winding gap (not labeled). Source electrode 84 includes sections 84*a* and 84*b* and drain electrode 86 includes sections 86*a*, 86*b* and 86*c*. Next, the portion of the top substrate surface beneath the aforementioned gap between the source and drain electrodes is etched out to a depth exceeding the thickness of the highly doped region thereby defining a winding groove 100 which can be readily seen in FIG. 6. At the same time the groove 100 is etched the substrate is etched around the outer lateral edges of the electrodes 84 and 86 to confine the previously mentioned high conductivity region 98 beneath the electrodes 84 and 86. Next, the remaining photoresist material overlying the substrate and electrodes thereon is removed to arrive at the structure shown in FIG. 6.

The aforementioned etching of the substrate to form the groove 100 is performed to effect physical and electrical isolation of adjacent portions of the high conductivity region 98 beneath the source and drain electrodes 84 and 86 which thereafter serve respectively as adjacent inter-digitated portions of respective source and drain regions in the ultimately obtained transistor 80. Thus the source and drain regions are defined using the molybdenum as an etching mask which does not pose any mask alignment problems.

Next, steps are performed to arrive at the structure shown in FIG. 7. An insulating layer of pyrolytic silicon dioxide 88, an insulating layer of silicon nitride 90, and an high resistivity noninsulating layer 92 of polycrystalline silicon are formed on top of the substrate over interdigitated portions of the source and drain electrodes 84 and 86 by using rather conventional techniques described and used in forming the similar layers in the FIG. 4 transistor. In this instance, the layers 88, 90 and 92 (shown in FIG. 7) do not extend over sections 84*a* and 86*a* of the source and drain electrodes 84 and 86. As shown in FIG. 7 the layer 92 includes a winding depression 102 wherein the material thereof extends without physical discontinuity from laterally contiguous portions of layer 92 downwardly into the groove 100 of the substrate. The three layers 88, 90, and 92 each tend to fill the groove 100 located thereunder as they extend continuously thereacross so that the substrate surface at the bottom of the groove 100 is necessarily covered by each of the layers which each bridge the width of the groove.

Next, the completely fabricated transistor 80, shown in FIG. 8, is produced by forming an aluminum gate electrode 94 (which may also be referred to as being a control electrode or a field electrode) and the contact electrode 96 upon the substrate using conventional aluminum deposition, photomasking, and aluminum etching procedures. The area of the electrode 94 is made as small as possible in order to obtain as high a cutoff frequency $f_c$ as possible.

Alternate steps and materials can obviously be used in fabricating a transistor having the structural features shown in FIG. 8.

The contact electrode 96 is in surface area contact with only the section 84*a* of the source electrode. The gate or control electrode 94 comprises a main section 94*a*, in surface area contact with section 86*a* of the drain electrode 86, and also a plurality of finger shaped sections 94*b* and an intermediate section 94*c* extending from the section 94*a* to the sections 94*b*. The sections 94*b* are located on top of the layer 92 so as to each overlie a selected section of the drain electrode 86 which is beneath the layers 88, 90, and 92. The intermediate section 94*c* extends laterally from the section 86a of the drain electrode 86 laterally up and over part of the layer 92. No part of the gate electrode 94 extends laterally on the layer 92 so as to overlie the aforementioned gap beneath the source and drain electrodes 84 and 86 or the groove 100 in the substrate which, as stated earlier, separates the highly conductive region 98 into laterally separated source and drain regions (which are disposed on opposite sides of the groove). Since overlapping of the control electrode 94 with both the source and drain electrodes 84 and 86 is avoided the capacitance inherently existing between electrodes 84 and 86 is desirably minimized.

Referring to FIGS. 6 to 8 generally it will be seen upon closer observation of FIGS. 6 and 7 that the drain electrode 86, as stated earlier, comprises a section 86*a*, sections 86*b*, and sections 86*c*. The sections 86*b* and 86*c* are finger shaped and are similar except that sections 86*c* are narrower than sections 86*b*, even though the width of the groove 100 remains constant from end to end. The sections 86*b* are referred to as selected drain electrode sections over which the gate electrode sections 94*b* are located (being separated therefrom by the layers 88, 90, and 92) and the sections 86*c* are referred to as nonselected sections over which no part of the gate electrode 94 overlies. The selected drain electrode sections 86*b* are purposely made wider to insure vertical alignment of the gate electrode sections 94*b* therewith since the masking procedure used in forming the gate electrode 94 necessarily may involve some misalignment error which is made less serious by making the selected drain electrode sections 86*b* sufficiently wide in the first instance. The source and drain electrode sections 84*b* and 84*c* are typically 0.3 mil wide, the control electrode sections 94*b* are typically 0.2 mil wide, and the drain electrode sections 86*b* are typically 0.6 mil wide. The source and drain regions are typically spaced apart about 0.2 mil. All of the source electrode sections 86*c* could be made as wide as the source electrode sections 86*b* but if this were done it would involve unnecessary waste of surface area in the transistor 80 and render the transistor less efficient for microwave switching applications.as a result of increased capacitance between electrodes 84 and 86.

In the transistor 80 the noted selective placement of gate electrode sections 94*b* is sufficient to insure that any voltage impressed on the gate electrode via connection made to the gate electrode section 94*a* will be equally manifested at various points in the layer 92 at least in the various portions thereof in the vicinity of the depression 102 overlying the groove 100 even though sizeable areas or sections of the layer 92 are laterally remote from and totally free of direct surface area contact with any section whatsoever of the gate electrode 94. As a result, gate electrode voltage biasing will be equally effective at all points along the groove 100 in the substrate 82 to vary the electrical conductivity of a portion of the substrate beneath the groove 100 across which current flow is to be controlled. Since the gate electrode 94 and the drain electrode 86 are vertically aligned stray capacitance in the transistor 80 is minimized thereby better adapting, as desired here, the transistor 80 for use in microwave switching applications.

Operation of the FIG. 8 device on the switching circuit shown is as follows. The switching signal source 60 can at a given point in time effect attraction or repulsion of charge carriers to or from the portion of the substrate 82 wherein the groove 100 is located to change, by electric field action, the electrical conductivity of the substrate in the current path between the source electrode 84 to the drain electrode 86. The electric field action causes charge carriers to exist in controlled degree in the subtrate 82.

It is pointed out that the transistor embodiments depicted in FIGS. 4 and 8, respectively, are essentially two terminal devices which can be readily mounted in a microwave coaxial cable or the like in a simple and convenient manner and then used for effecting switching of microwave signals. It is possible to utilize the transistors described in a modified form as three terminal switching devices. The FIG. 4 transistor can be so modified and used by forming the electrode sections **26*a* and 26*c* as separate, discrete electrodes (i.e., electrodes which are not conductively connected by an electrode section 26*b*) and connecting a signal source like source 60 between the electrode section 26c and electrode 22 while connecting the source 58 and load 50 between the electrodes 22 and 24 to effect switching of the transistor between conductive and nonconductive state. The FIG. 8 transistor can be modified and used by separating the field electrode 94 from the drain electrode 86 (e.g., by eliminating the electrode section 94*a* so that the electrode 94 includes only sections 94*b* and 94*c* which are not in contact with the electrode 86) and connecting a signal source like source 60 between the electrode 84 or 86 and the electrode 94** separated therefrom.

In the embodiments of FIGS. 4 and 8 the distance between the source and drain electrodes (22 and 24 or 84 and 86) called the length L is small compared to the distance called the width W over which the space extends, in directions normal to the length L, so that the ratio of W divided by L is large. Since the distance L is practically speaking limited, by process factors, to being no less than about 0.2 mil at the least the interdigitation of the source and drain electrodes increases the distance W to impart a low on resistance of the device embodiments which results in an increased cutoff frequency $f_c$.

While different embodiments of the invention have been shown and described other embodiments may be constructed by making obvious modifications and accordingly it is intended that the scope of the present invention be determined solely by the claims appended hereto. Much of the description pertaining to each embodiment applies to the other embodiment.

What is claimed is:

1. An insulated gate field effect transistor for switching microwave signals comprising, in combination:

a. an intrinsic semiconductor substrate having a major surface;

b. a doped region formed in said substrate whereby a channel region is defined;

c. an insulating layer on said substrate surface over said channel region;

d. a resistive gate layer located over said channel region and extending beyond to at least partially overlap said doped region;

e. a pair of spaced electrodes located over said channel region, spaced from each other, in contact with said gate layer, and in non-overlapping relationship with respect to said doped region;

f. means in contact with said resistive gate layer for applying a control voltage to create a conductive inversion layer in said channel region;

g. means in ohmic contact with said doped region for injecting carriers into said channel region; and h. means for providing an output across said pair of spaced electrodes.

2. The transistor of claim 1 wherein the resistivity of said resistive gate layer is in excess of 1,000 ohms per square.

3. The transistor of claim 1 wherein said pair of spaced electrodes are interdigitated.

4. The transistor of claim 1 wherein said means in contact with said resistive layer includes a selected one of said pair of spaced electrodes.

5. The transistor of claim 4 wherein said means for injecting carriers includes a control electrode capacitively coupled to the non-selected one of said pair of spaced electrodes and said means for providing an output includes said control electrode and said selected one of said pair of spaced electrodes.

* * * * *